United States Patent
Lei et al.

(10) Patent No.: US 11,538,705 B2
(45) Date of Patent: Dec. 27, 2022

(54) PLASMA PROCESSING SYSTEM AND OPERATING METHOD OF THE SAME

(71) Applicant: Advanced Micro-Fabrication Equipment Inc. China, Shanghai (CN)

(72) Inventors: Larry Lei, Shanghai (CN); Qian Wang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 616 days.

(21) Appl. No.: 16/228,536

(22) Filed: Dec. 20, 2018

(65) Prior Publication Data
US 2019/0206710 A1 Jul. 4, 2019

(30) Foreign Application Priority Data

Dec. 29, 2017 (CN) .......................... 201711480475.5

(51) Int. Cl.
*H01L 21/67* (2006.01)
*H01L 21/677* (2006.01)
(Continued)

(52) U.S. Cl.
CPC .. *H01L 21/67754* (2013.01); *H01J 37/32743* (2013.01); *H01J 37/32899* (2013.01);
(Continued)

(58) Field of Classification Search
None
See application file for complete search history.

(56) References Cited

U.S. PATENT DOCUMENTS 5,764,013 A * 6/1998 Yae .......................... B25J 9/042
318/568.11
6,155,768 A * 12/2000 Bacchi .............. H01L 21/67742
414/416.03
(Continued)

*Primary Examiner* — Michael S Lowe
(74) *Attorney, Agent, or Firm* — Womble Bond Dickinson (US) LLP; Joseph Bach, Esq.

(57) ABSTRACT

Embodiments of the present disclosure provide a plasma processing system, comprising: a transfer chamber, the transfer chamber including a plurality of sidewalls, each sidewall being connected with a plurality of process chambers; each process chamber including a base therein, the base including a central point; wherein at least two process chambers connected to a same sidewall form one process chamber group, wherein a first distance is provided between the central points of two bases in a first process chamber group, and a second distance is provided between the central points of two bases in a second process chamber group, the first distance being greater than the second distance; and the transfer chamber comprises a mechanical transfer device; a rotating pedestal includes two independently movable robot arms thereon, the two robot arms; and the two robot arms both include a plurality of rotating shafts and a plurality of rotating arms, wherein a remote rotating arm of each robot arm further includes an end effector for holding a substrate. The mechanical transfer device according to the present disclosure may simultaneously retrieve and place the substrate in the process chamber group with the first distance and the substrate in the process chamber group with the second distance.

12 Claims, 4 Drawing Sheets

(51) Int. Cl.
*H01L 21/687* (2006.01)
*H01J 37/32* (2006.01)

(52) U.S. Cl.
CPC .. *H01L 21/67161* (2013.01); *H01L 21/67167* (2013.01); *H01L 21/67196* (2013.01); *H01L 21/67742* (2013.01); *H01L 21/68707* (2013.01); *H01J 2237/20214* (2013.01); *H01J 2237/20278* (2013.01); *H01L 21/67201* (2013.01)

(56) References Cited

U.S. PATENT DOCUMENTS

| | | | | |
|---|---|---|---|---|
| 8,007,218 | B2* | 8/2011 | Park | H01L 21/67742 |
| | | | | 414/217 |
| 8,060,252 | B2* | 11/2011 | Gage | H01L 21/67196 |
| | | | | 700/248 |
| 8,376,685 | B2* | 2/2013 | Pietrantonio | H01L 21/677 |
| | | | | 414/744.5 |
| 8,777,547 | B2* | 7/2014 | Kremerman | H01L 21/67742 |
| | | | | 414/744.5 |
| 8,784,033 | B2 | 7/2014 | Kremerman et al. | |
| 10,500,719 | B2 | 12/2019 | Muthukamatchi et al. | |
| 2006/0033678 | A1* | 2/2006 | Lubomirsky | H01L 21/67745 |
| | | | | 345/32 |
| 2012/0063874 | A1* | 3/2012 | Kremerman | H01L 21/67742 |
| | | | | 414/744.3 |
| 2012/0232690 | A1* | 9/2012 | Gilchrist | B25J 9/043 |
| | | | | 700/228 |

\* cited by examiner

PLASMA PROCESSING SYSTEM AND OPERATING METHOD OF THE SAME

RELATED APPLICATION

The present application claims priority to and the benefit of Chinese Patent Application No. 201711480475.5, filed on Dec. 29, 2017, and the disclosure of which is hereby incorporated herein by reference in its entirety.

FIELD

Embodiments of the present disclosure generally relate to the field of semiconductor manufacturing, specifically relate to a plasma processing system, and more particularly relate to a mechanical transfer apparatus in the plasma processing system and a method of operating the same.

BACKGROUND

Semiconductor chips are increasingly applied in various kinds of electronic devices, while manufacturing of semiconductor chips needs a considerable number of plasma processors that perform processing such as plasma etching and CVD (Chemical Vapor Deposition) on to-be-processed substrates. Various kinds of process chambers are needed during plasma processing. For example, the etching and CVD mentioned above all need corresponding process chambers to execute such processing; other processing such as stripping and coating of photoresist also need special process chambers. A load lock is also needed to load a substrate into/out of a vacuum environment from atmosphere; a transfer chamber is also needed to transfer the substrate between different process chambers and the load lock; inside the transfer chamber is further provided at least one robot arm for accurately transferring and disposing the unprocessed and processed substrates in the vacuum environment. The process chambers having the above functions are all required to be arranged around the transfer chamber. To make the entire plasma reactor more compact, i.e., mounting more process chambers to a same transfer chamber, the prior art provides a chamber body layout structure shown in the U.S. Pat. No. 6,486,444. In the prior art, two process chambers are integrated into one process chamber group, the two process chambers being connected to a same transfer chamber sidewall, and the other side facets being also used by other process chamber groups. The last side facet is occupied by the load lock available for two substrates to transfer simultaneously.

Compared with earlier prior arts, although the layout structure may accommodate more process chambers, it has only limited processing functions, where only one processing can be performed, such as plasma etching. With development of processing, it is desired to perform multiple functions within one plasma processing system, so as to save the time for transiting the substrate between different processing systems and prevent potential contaminations during transiting in the atmosphere, thereby improving the overall processing efficiency. However, a new problem arises when process chambers of different functions are arranged in a same plasma processing system. Process chambers with different functions will differ in internal spaces and external sizes, which will cause different central point distances of two juxtaposed plasma process chambers mounted to different sidewalls of the transfer chamber. Because the original robot arms in the transfer chamber are designed for retrieving and placing two process chambers with a fixed central point distance, it is impossible to perform a new task of the plasma processing system using the original robot arms.

Therefore, it is desired to develop a new robot arm in the industry to retrieve and place, with only one robot arm, a plurality of substrates between process chamber groups having different central point distances. Optimally, the robot arm should have a simple structure and a low cost and may be applied to various kinds of plasma processing systems.

SUMMARY

The present disclosure provides a plasma processing system, comprising: a transfer chamber, the transfer chamber including a plurality of sidewalls, each sidewall being connected with a plurality of process chambers, a slit valve being further provided between a transfer chamber sidewall and each process chamber; each process chamber including a base therein for placing a substrate, the base including a central point that corresponds to a central point position of the substrate placed on the base; wherein at least two process chambers connected to a same sidewall form one process chamber group, wherein a first distance is provided between the central points of two bases in a first process chamber group, and a second distance is provided between the central points of two bases in a second process chamber group, the first distance being greater than the second distance; the transfer chamber comprises a mechanical transfer device, the mechanical transfer device comprising a pedestal rotating about a central rotating shaft, the central rotating shaft being disposed at a central point of the mechanical transfer device, the pedestal including two independently movable robot arms thereon, the two robot arms being symmetrically mounted at two sides of the central rotating shaft of the rotating pedestal; and the two robot arms both include a plurality of rotating shafts and a plurality of rotating arms, wherein a remote rotating arm of each robot arm further includes an end effector for holding a substrate. The plasma processing system further comprises a third process chamber group, a third distance being provided between central points of the two bases in the third process chamber group.

In one embodiment, two process chambers in the first process chamber group are configured for performing first processing, and the process chambers in the second process chamber groups are configured for performing second processing.

In one embodiment, the remote rotating arm of each robot arm includes a proximal portion and a remote portion, a bending portion is connected between the remote portion and the proximal portion, the remote portions of the rotating arms disposed at the utmost tops of the two robot arms being parallel to each other and vertically stacked with each other, the remote portion covering the central point of the mechanical transfer device.

Preferably, each robot arm includes at least three rotating arms and three robot arm rotating shafts, the robot arm rotating shafts may drive the rotating arms to rotate, and at least one rotating shaft in each robot arm may move upwardly and downwardly.

In one embodiment, at least one load lock is further provided between two process chambers of the first process chamber group, and the two process chambers and the load lock are both connected to a same transfer chamber sidewall. Further, two load locks are provided between the two process chambers of the first process chamber group, a first load lock being stacked above a second load lock. During an operating process of the plasma processing system having two stacked load locks, the first robot arm and the second robot arm move two substrates to a same vertically stacked position in the transfer chamber as an actuating position, respectively; after the first substrate and the second substrate arrive at the actuating position, the first robot arm and the second robot arm are driven to load the first substrate and the second substrate into the two load locks, respectively.

Each process chamber in the first process chamber group and the second process chamber group includes a channel such that the substrates may reach respective process chambers along the channel, an included angle between the transfer chamber sidewall and the moving track of the central point of the substrate in the channel being less than 90°.

A first group of channels are provided in two process chambers of the first process chamber group, the substrate runs along the first group of channels, and a first included angle $\theta_1$ is provided between a first moving track formed by the central point of the substrate during running and the transfer chamber sidewall; a second group of channels are provided in two process chambers of the second process chamber group, the substrate runs along the second group of channels, and a second included angle $\theta_2$ is provided between a second moving track formed by the central point of the substrate during running and the transfer chamber sidewall, wherein $\theta_1$ is smaller than $\theta_2$.

The present disclosure further provides an operating method of the plasma processing system, wherein the first robot arm and the second robot arm move a first substrate and a second substrate to a first position and a second position in a transfer chamber, respectively, the first position and the second position being both located at a circle with a distance R1 to a central rotating shaft of the mechanical transfer device, a distance D1 being provided between the first position and the second position; after the first substrate and the second substrate arrive at the first position and the second position, the first robot arm and the second robot arm are driven to load the first substrate and the second substrate into the two process chambers of the first process chamber group. Further, the first robot arm and the second robot arm move a third substrate and a fourth substrate to a third position and a fourth position in the transfer chamber, respectively, the third position and the fourth position being both located at a circle with a distance R2 to a central rotating shaft of the mechanical transfer device, a distance D2 being provided between the third position and the fourth position; after the third substrate and the fourth substrate arrive at the third position and the fourth position, the first robot arm and the second robot arm are driven to feed the third substrate and the fourth substrate into the two process chambers of the second process chamber group, wherein R1 is greater than R2, and D1 is greater than D2. The process chambers of different sizes according to the present disclosure may drive the robot arms with different actuating positions and motion trajectories, such that the robot arms of the present disclosure are adapted to process chamber groups with different central point distances.

DETAILED DESCRIPTION OF EMBODIMENTS

Hereinafter, the preferred embodiments of the present disclosure will be described in further detail with reference to FIGS. 1-3.

Figure 1A:
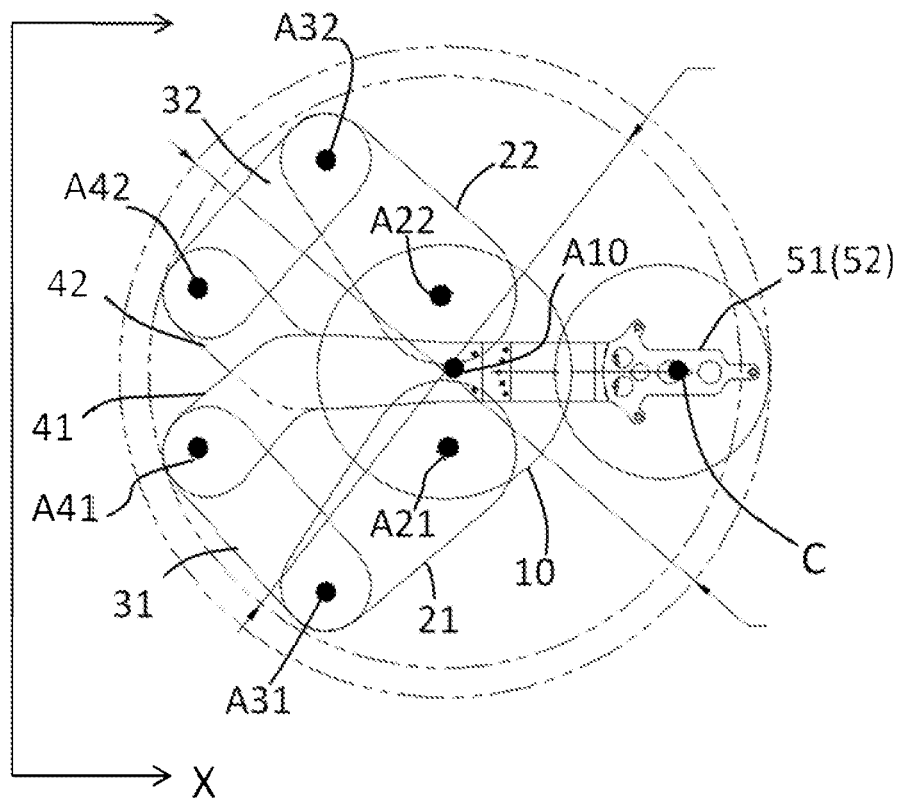
FIG. 1a is a top view of a robot arm of the present disclosure.

As shown in FIG. 1a, the mechanical transfer apparatus according to the present disclosure comprises a rotating pedestal 10, the rotating pedestal 10 controllably rotating about a rotating shaft A10 below. The rotating pedestal 10 comprises two rotating shafts A22 and A21 symmetrically arranged at different sides of the rotating shafts A10 along a central line. A first end of the rotating arm 22 is connected to the rotating pedestal 10 via the rotating shaft A22, and a first end of the rotating arm 21 is connected to the rotating pedestal 10 via the rotating shaft A21. A second end of the rotating arm 22 includes a rotating shaft A32 thereon; a first end of the rotating arm 32 is connected to a second end of the rotating arm 22 via the rotating shaft A32; a second end of the corresponding rotating arm 21 includes a rotating shaft A31 thereon; a first end of a rotating arm 31 is connected to a second end of the rotating arm 21 via the rotating shaft A31. A second end of the rotating arm 32 includes a rotating shaft A42; a first end of the rotating arm 42 is connected to a second end of the rotating arm 32 via the rotating shaft A42; a second end of the rotating arm 31 includes a rotating shaft A41; a first end of a rotating arm 41 is connected to a second end of the rotating arm 31 via the rotating shaft A41. The rotating arm 41 has a bending portion thereon such that a second end of the rotating arm 41, i.e., a remote portion remote from the rotating shaft 10, is not disposed in a same lengthwise straight line as the proximal portion proximal to the rotating shaft, wherein the remote portion of the rotating arm 42 just covers the rotating shaft A10 below; moreover, a tip of the remote portion further comprises an end effector 51 for holding a substrate to be transferred. Likewise, the rotating arm 42 also has a bending portion such that a second end (the remote portion) of the rotating arm 42 is not disposed in a same lengthwise straight line as the first end (the distal portion), wherein the remote portion of the rotating arm 42 just covers the rotating shaft A10 below; moreover, a tip of the remote portion further comprises an end effector 52 for holding a substrate to be transferred. The substrate 90 disposed on the end effector 51, 52 has a central point C, and the central point corresponds to a specific point on the end effector.

Figure 1B:
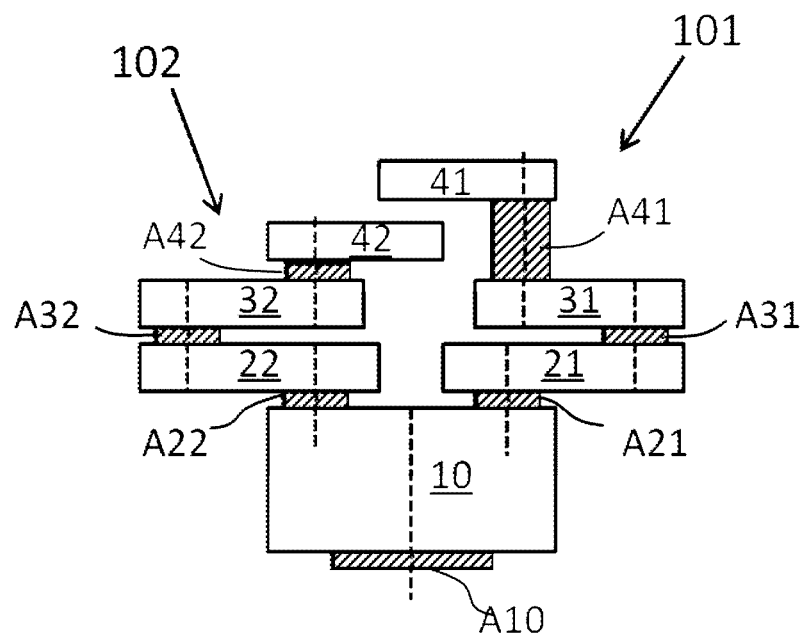
FIG. 1b is a side view of a robot arm of the present disclosure.

FIG. 1b shows a side view of the mechanical transfer apparatus according to the present disclosure, and the specific view is a side view in the X direction in the top view shown in FIG. 1a. FIG. 1b comprises a first robot arm 101 and a second robot arm 102, wherein the first robot arm 101 comprises rotating shafts A21, A31, A41 and rotating arms 21, 31, 41; the second robot arm 102 comprises rotating shafts A22, A32, A42 and rotating arms 22, 32, 42; the first and second robot arms are both disposed on the rotating pedestal 10 and may rotate independently. Motors may be provided in the rotating shafts A21, A31, A41, A22, A32, A42, and A10, such that these rotating shafts may all rotate independently; further, an actuating device may be further provided inside at least one of these rotating shafts such that the rotating shaft may be elevated vertically, and the end effector 51, 52 may move upwardly and downwardly through elevation.

Figure 2A:
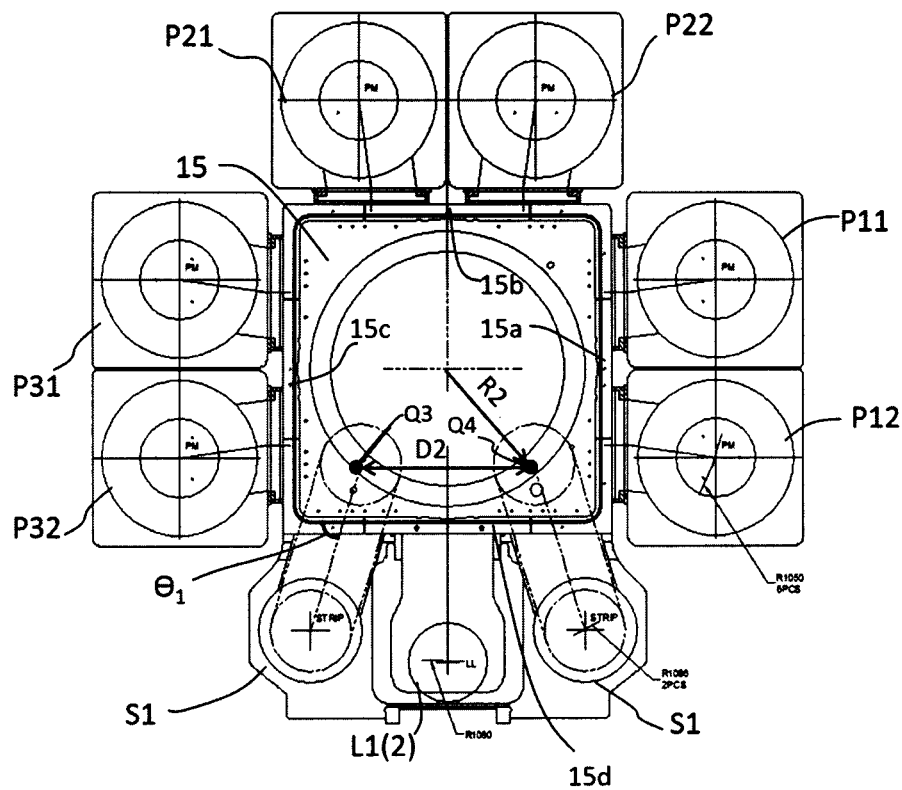
FIG. 2a is a schematic diagram of the plasma processing system and a running trajectory of loading a substrate into a first process chamber according to the present disclosure.

FIG. 2a is a schematic diagram of the plasma processing system and a moving track of loading a substrate into a first process chamber according to the present disclosure. It may be seen from the figure that the plasma processing system according to the present disclosure comprises a transfer chamber 15 at the center, three plasma process chamber groups on four sidewalls 15a~15d surrounding the transfer chamber 15 include a first group (P11, P12), a second group (P21, P22), and a third group (P31, P32); two processing units (e.g., P11, P12) in each process chamber group have the same structure, and the sidewalls of two processing units are closely attached to each other or integrated into a shared sidewall, and both process chambers in one group are then connected to the sidewalls of the same transfer chamber 15. The transfer chamber sidewall 15d further comprises two strip chambers S1, S2 and load locks L1, L2 disposed between the two strip chambers, wherein L1 and L2 are vertically stacked, such that L2 cannot be directly seen from the top view of FIG. 2a. Slit valves are further provided between each process chamber and the transfer chamber, and the user may control opening or closing of the slit valves, such that the respective process chambers are mutually isolated from the transfer chamber when performing plasma processing. Because three chamber bodies are transversely disposed on the sidewall 15d, the central point distance of the two strip chambers S1, S2 is apparently greater than the central point distance of the two process chambers P11, P12. Particularly, the central point of the process chamber refers to a central point of a base for placing substrate in each process chamber, also referred to the position of the central point C of the substrate in the process chamber during the plasma processing procedure. When it is needed to place the substrate 90 into the strip chambers S1, S2 through the two robot arms of the mechanical transfer apparatus, the rotating shaft A10 of the mechanical transfer apparatus is first actuated such that the two robot arms 101 and 102 are both facing the two strip chambers, and then the plurality of rotating shafts A21, A31, A41, A22, A32, and A42 and respective rotating arms are driven to cause the end effectors 51, 52 to extend outwardly by a small distance, such that the central points of the substrates on the end effectors 51, 52 reach the positions Q3, Q4, wherein the distance from Q3, Q4 to the central position of the transfer chamber 15 is R2. Meanwhile, a horizontal distance between Q3 and Q4 is D2. The values of the R2 and D2 are selected according to the central point distance, size and shape of the process chambers to be entered, and may be optimized according to needs. After the end effectors 51, 52 arrive at the actuating positions of the Q3, Q4, the slit valves are opened to drive the robot arms 101 and 102 such that the end effectors 51, 52 carry their own substrates move to the central points in the strip chambers S1, S2, such that after the central points of the substrates are aligned with the central point of the base in the strip chambers S1, S2, a plurality of support pins in the bases of the two strip chambers are raised to support the substrates, the robot arms 101, 102 are retracted, and then the plurality of support pins are gradually descended, such that the substrates stably are supported by the upper facet of the base in the strip chambers S1, S2, thereby completing loading of the substrate. After completing processing of the substrate, a reverse procedure may be set.

Figure 2B:
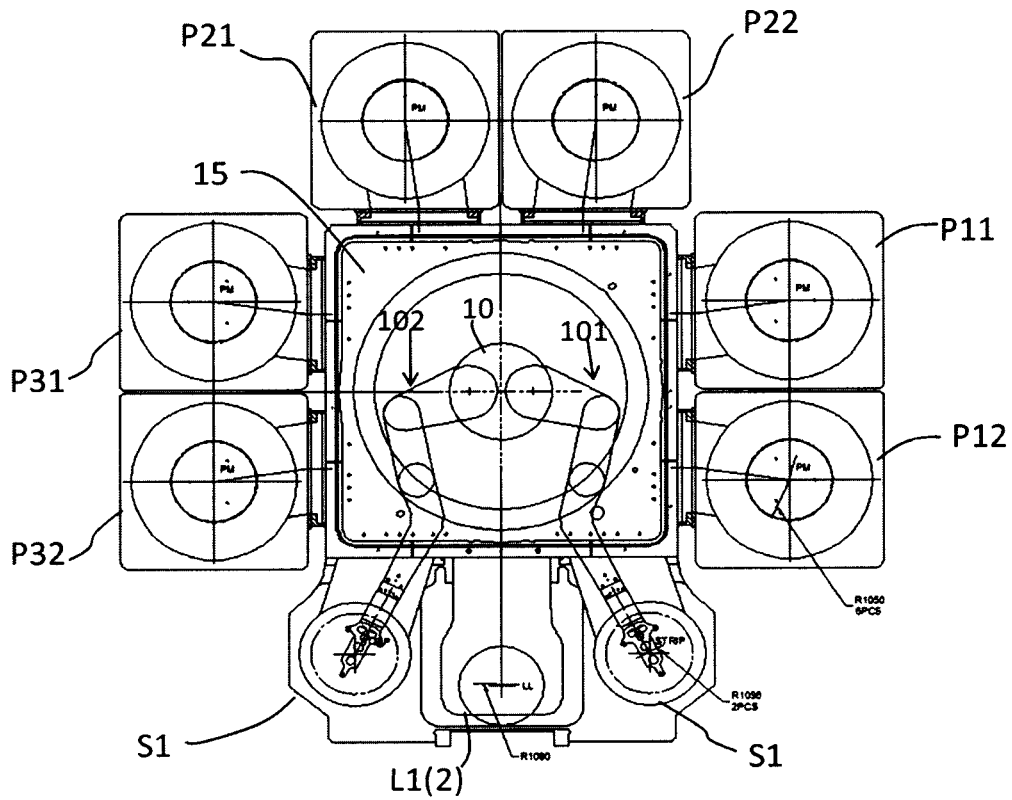
FIG. 2b is a schematic diagram of the plasma processing system where the robot arm extends to the first process chamber according to the present disclosure.

FIG. 2b shows an extension and motion state of respective robot arms and rotating shafts in the robot arms 101, 102 when the robot arms 101 and 102 transfer the substrates to the strip chambers S1, S2.

Figure 3A:
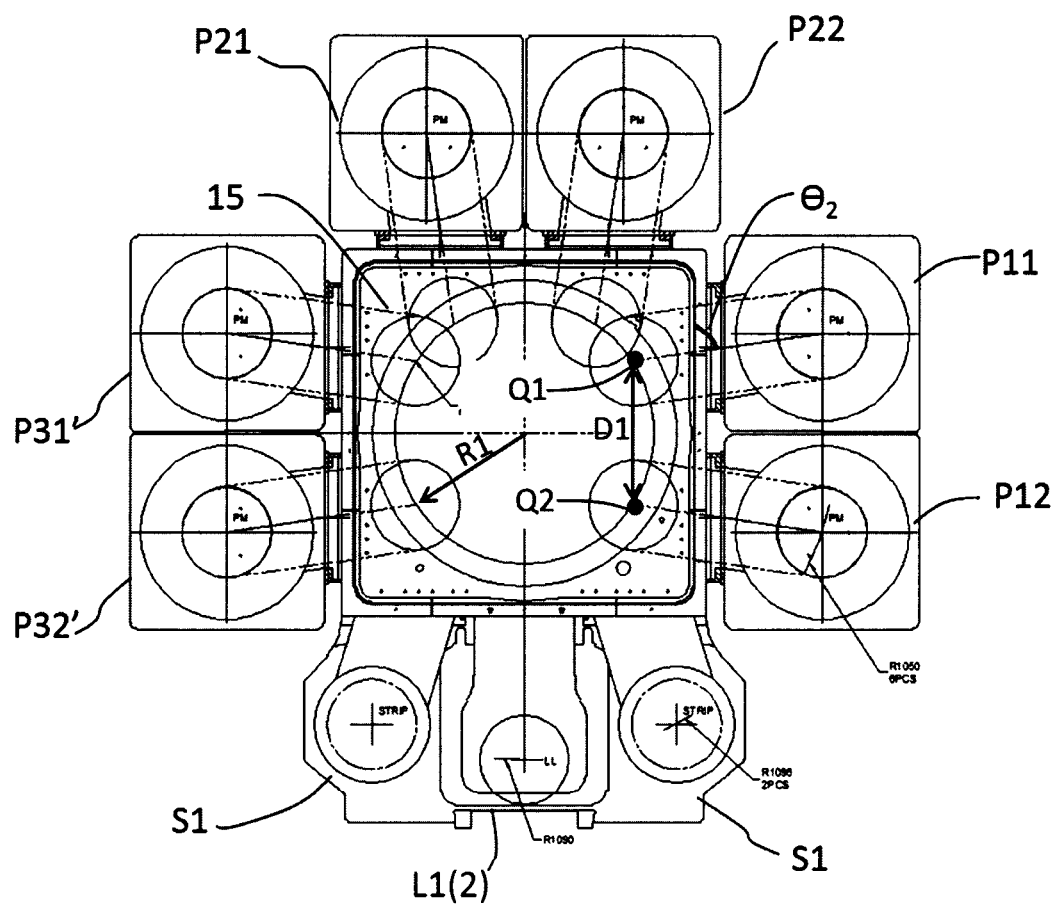
FIG. 3a is a schematic diagram of the plasma processing system and a running trajectory of loading the substrate into the second process chamber according to the present disclosure.

FIG. 3a is a schematic diagram of the plasma processing system and a moving track of loading the substrate into the second process chamber according to the present disclosure. When it is needed to simultaneously transfer two substrates into second process chambers (plasma process chambers P11, P12 or P31, P32), the rotating pedestal 10 is first controlled to move the two robot arms 101, 102 to face the process chambers into which the substrates are to be loaded; then, the robot arms are actuated to cause the central points of the substrates on the robot arms to be located at two positions Q1, Q2 shown in the figure, wherein the distance from Q1, Q2 to the center of the transfer chamber is R1, wherein R1 is smaller than R2. The horizontal distance D1 between the two positions Q1, Q2 is also smaller than the horizontal distance D2. The parameters R1 and D1 are selected according to the shape and size of the process chambers P11, P12 to be entered. After arriving at the actuation positions Q1, Q2, the robot arms 101 are driven to cause the centers of the substrates to move along a connecting line between Q1 and the central point of the process chamber P11, and finally cause the substrates to arrive at the center of the process chamber P11; meanwhile, the robot arm 102 is driven to cause the center of the substrate to move along a connecting line between Q2 and the central point of the process chamber P12, and finally cause the substrate to arrive at the center of the process chamber P12.

Figure 3B:
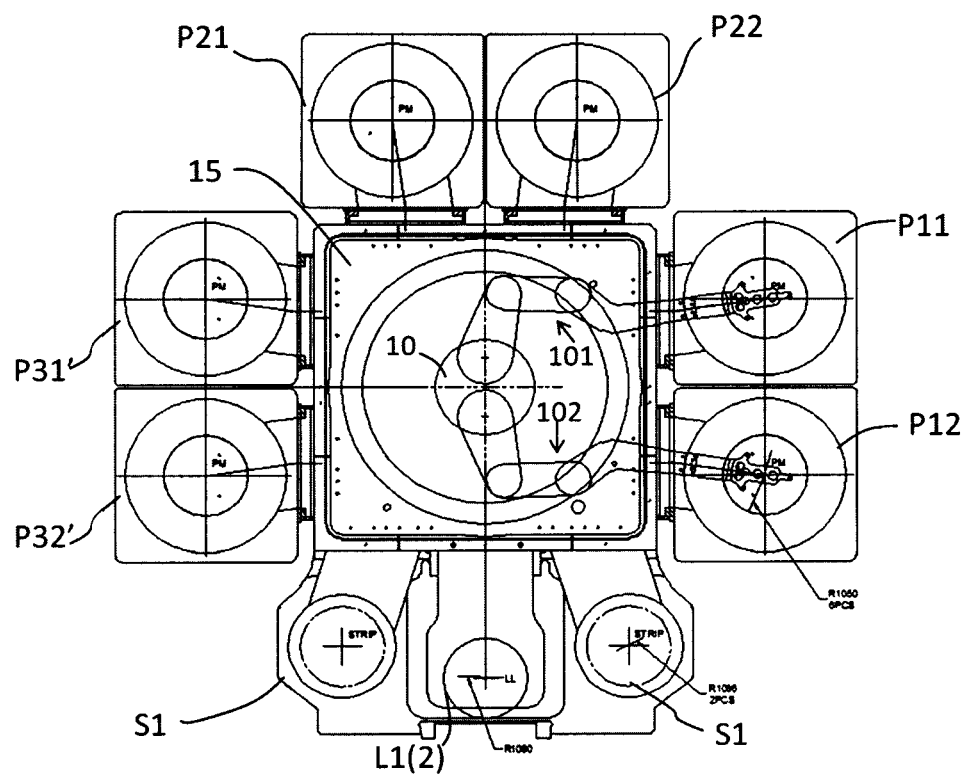
FIG. 3b is a schematic diagram of the plasma processing system where the robot arm extends to the second process chamber according to the present disclosure.

FIG. 3b is a schematic diagram of the plasma processing system where the robot arm extends to the second process chamber according to the present disclosure, i.e., the extension and motion states of respective rotating arms and rotating shafts in the robot arms 101, 102 when the robot arms 101 and 102 transfer the substrates to the process chambers P11, P12.

The mechanical transfer apparatus according to the present disclosure is further required to cause two robot arms to enter the load locks L1, L2 to retrieve and place the substrates; In this case, the pedestal 10 of the mechanical transfer apparatus may be rotated such that the two end effectors 51, 52 on the robot arms 101, 102 face the load locks L1, L2; moreover, the robot arms 101, 102 are in a stacked state like the two end effectors 51, 52 shown in FIG. 1, and the remote portions of the rotating arms 41, 42 are disposed on a connecting line between the central point of the transfer chamber and the central point of the load lock; afterwards, the two robot arms respectively drive a plurality of rotating shafts and rotating arms, such that the two end effectors 51, 52 directly move towards the centers of the load locks L1, L2. The mechanical transfer apparatus provided by the present disclosure may also simultaneously retrieve and place the substrates in the two vertically stacked load locks.

In the present disclosure, because the end effector on the robot arm moves directly from the actuating position (Q1/Q2/Q3/Q4) to the central position of the process chamber (P11, P12) or strip chamber (S1, S2), wherein the connecting line between the actuating position and the central position of the corresponding chamber body is not vertical to the plane of the sidewall (15a/15d) of the transfer chamber 15, but has a certain angle θ (less than 90°); therefore, the moving track of the substrate is also tilted, and the direction of an opening channel on the corresponding process chamber for the substrate to pass through must also be tilted. Specifically, because the distance between the central points of the strip chambers S1, S2 is larger, its angle $\theta_1$ will be slightly smaller than the angle $\theta_2$ between the position Q3, Q4 to the process chamber P11, P12. Because the connecting line between the central position of the load lock and the actuation position when the robot arm transfers the substrate is vertical to the transfer chamber sidewall 15d, the transfer channel provided on the load lock is vertical to the transfer chamber sidewall 15d, i.e., $\theta=90°$. Wherein under drive of the two robot arms, the actual moving track of the central point of the substrate is substantially identical to the connecting line between the actuation position and the central point of the corresponding base; the moving track may also be partially adjusted according to actual demands of the robot arms, but the substrates arriving at the process chambers are constantly transferred along the channels oblique to the transfer chamber sidewalls.

Besides the plasma process chambers (P11~P32) and the strip chambers (S1, S2) shown in FIG. 2-3, the plasma processing system of the present disclosure may further comprise more types process chambers, e.g., the plasma processing system shown in FIG. 3 comprises process chambers P31', P32' of a new structural size, which may perform processing different from P11, P21; therefore, besides the first fixed distance between the central points of process chambers P11, P12 and between the central points of P21, P22, a second fixed distance is provided between the central points of P31', P32', and a fixed third distance is provided between the central points of the two strip chambers S1, S2. The mechanical transfer apparatus with a special structure according to the present disclosure may be adapted to as many as three types of process chamber groups with different distances, thereby implementing simultaneous retrieval and placement of the substrates in two process chambers of one group. Although, due to the long recipe time or substrate processing difference, one process chamber in one process chamber group is selected to run, while the other one is idle; in such circumstances, it merely needs to load the substrate in one process chamber (P11) in one process chamber group (P11, P12); In this case, with reference to the operating method described above, the present disclosure may drive one corresponding robot arm thereof to retrieve the substrate from the process chamber that has completed processing, while the other robot arm is in an idle state. Therefore, the mechanical transfer apparatus according to the present disclosure may not only work in a dual mode to simultaneously retrieve and place two substrates from/to one process chamber group, but also may work in a single mode to separately retrieve and place the substrates with only one robot arm thereof.

The bending portion arranged in the rotating arms 41, 42 in the robot arms 101, 102 according to the present disclosure may cause the two rotating shafts A41, A42 apart from each other when the two basic rotating shafts A21, A22 of the robot arms 101, 102 are not disposed at the center of the pedestal 10, thereby preventing the second ends of the rotating arms 31, 32 in the same height from colliding with each other, without a need to make too much height configuration to the rotating arms 31, 32. Meanwhile, due to existence of the bending portion, the rotating arms 41, 42 may enter the load locks L1, L2 while maintaining a vertically stacked and parallel moving state, which reduces the difficulty of controlling respective rotating shafts in the robot arms. On the other hand, the bending portion according to the present disclosure enables the end effectors 51, 52 to more easily enter respective process chambers along a moving track oblique to the transfer chamber sidewall.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

The invention claimed is:

1. A plasma processing system, comprising:
a transfer chamber maintaining a vacuum environment, the transfer chamber including a sidewall, the sidewall having at least four facets, a plurality of plasma process chambers mounted on each of the facets to surround the sidewall such that the transfer chamber is positioned at the center of the system, a plurality of slit valves are being further provided on each facet of the sidewall between the transfer chamber and each plasma process chamber, and wherein a loadlock is further attached to one of the facets, in addition to the plasma process chambers attached to the one of the facets, to load substrates into and out of the vacuum environment from atmosphere;
each plasma process chamber including a base therein for placing a substrate, the base including a central point that corresponds to a central point position of the substrate placed on the base;
wherein at least two plasma process chambers connected to a same sidewall facet form one process chamber group, wherein the two plasma process chambers have sidewalls attached to each other such that the two plasma process chambers are mutually isolated, and wherein a first distance is provided between the central points of two bases in a first process chamber group, and a second distance is provided between the central points of two bases in a second process chamber group, the first distance being greater than the second distance; and
the transfer chamber comprises a mechanical transfer device, the mechanical transfer device comprising a pedestal that is rotatable about a central rotating shaft, the central rotating shaft being disposed at a central point of the mechanical transfer device, the pedestal including two independently movable robot arms thereon, the two robot arms being symmetrically mounted at two sides of the central rotating shaft of the rotating pedestal; and the two robot arms both include a plurality of rotating shafts and a plurality of rotating arms, wherein a remote rotating arm of each robot arm has a bent shape and further includes an end effector for holding a substrate.

2. The plasma processing system according to claim 1, wherein the remote rotating arm of each robot arm includes a proximal portion connected to one of the rotating shafts and a remote portion, wherein the bent shape connects between the remote portion and the proximal portion, so that when the remote portions of the rotating arms are disposed vertically stacked with each other and covering the central point of the mechanical transfer device, the rotating shaft connected to the proximal portions are positioned apart from each other and are not vertically overlap each other.

3. The plasma processing system according to claim 1, wherein each robot arm includes at least three rotating arms and three robot arm rotating shafts, the robot arm rotating shafts may drive the rotating arms to rotate, and at least one rotating shaft in each robot arm may move upwardly and downwardly.

4. The plasma processing system according to claim 1, wherein the load lock is provided between two plasma process chambers of the first process chamber group, and the two plasma process chambers and the load lock are both connected to a same facet of the transfer chamber sidewall.

5. The plasma processing system according to claim 4, wherein two load locks are provided between the two plasma process chambers of the first process chamber group, a first load lock being stacked above a second load lock.

6. The operating method of the plasma processing system according to claim 5, wherein the first robot arm and the second robot arm move two substrates to a common vertically stacked position in the transfer chamber as an actuating position, respectively; and after the first substrate and the second substrate arrive at the actuating position, the first robot arm and the second robot arm are driven to load the first substrate and the second substrate into the two load locks, respectively.

7. The plasma processing system according to claim 1, wherein each plasma process chamber in the first process chamber group and the second process chamber group includes a channel such that the substrates reach respective plasma process chambers along the channel, an included angle between the transfer chamber sidewall and the moving track of the central point of the substrate in the channel being less than 90°.

8. The plasma processing system according to claim 7, wherein a first group of channels are provided in two plasma process chambers of the first process chamber group, the substrate runs along the first group of channels, and a first included angle θ1 is provided between a first moving track formed by the central point of the substrate during running and the transfer chamber sidewall; and a second group of channels are provided in two plasma process chambers of the second process chamber group, the substrate runs along the second group of channels, and a second included angle θ2 is provided between a second moving track formed by the central point of the substrate during running and the transfer chamber sidewall, wherein θ1 is smaller than θ2.

9. The plasma processing system according to claim 1, further comprising a third process chamber group, a third distance being provided between central points of the two bases in the third process chamber group.

10. An operating method of the plasma processing system according to claim 1, wherein the first robot arm and the second robot arm move a first substrate and a second substrate to a first position and a second position in a transfer chamber, respectively, the first position and the second position being both located at a circle with a distance R1 to a central rotating shaft of the mechanical transfer device, a distance D1 being provided between the first position and the second position; after the first substrate and the second substrate arrive at the first position and the second position, the first robot arm and the second robot arm are driven to load the first substrate and the second substrate into the two plasma process chambers of the first process chamber group.

11. The operating method of the plasma processing system according to claim 10, wherein the first robot arm and the second robot arm move a third substrate and a fourth substrate to a third position and a fourth position in the transfer chamber, respectively, the third position and the fourth position being both located at a circle with a distance R2 to a central rotating shaft of the mechanical transfer device, a distance D2 being provided between the third position and the fourth position; after the third substrate and the fourth substrate arrive at the third position and the fourth position, the first robot arm and the second robot arm are driven to feed the third substrate and the fourth substrate into the two plasma process chambers of the second process chamber group, wherein R1 is greater than R2, and D1 is greater than D2.

12. The operating method of the plasma processing system according to claim 11, wherein two plasma process chambers in the first process chamber group are configured for performing first processing, and the plasma process chambers in the second process chamber groups are configured for performing second processing.

* * * * *